United States Patent
Imai et al.

(10) Patent No.: US 8,933,484 B2
(45) Date of Patent: Jan. 13, 2015

(54) HEAT TRANSFER MEMBER AND MODULE WITH THE SAME

(71) Applicants: Makoto Imai, Toyota (JP); Atsushi Tanida, Nisshin (JP); Takashi Asada, Nisshin (JP); Masanori Usui, Seto (JP); Tomoyuki Shoji, Nisshin (JP)

(72) Inventors: Makoto Imai, Toyota (JP); Atsushi Tanida, Nisshin (JP); Takashi Asada, Nisshin (JP); Masanori Usui, Seto (JP); Tomoyuki Shoji, Nisshin (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 70 days.

(21) Appl. No.: 13/906,930

(22) Filed: May 31, 2013

(65) Prior Publication Data

US 2013/0341781 A1 Dec. 26, 2013

(30) Foreign Application Priority Data

Jun. 4, 2012 (JP) ................................ 2012-126705

(51) Int. Cl.
| | |
|---|---|
| H01L 23/34 | (2006.01) |
| H01L 23/495 | (2006.01) |
| H01L 23/36 | (2006.01) |
| H01L 23/373 | (2006.01) |
| H01L 23/473 | (2006.01) |
| H01L 23/492 | (2006.01) |
| H01L 23/00 | (2006.01) |

(52) U.S. Cl.
CPC .......... *H01L 23/49568* (2013.01); *H01L 23/36* (2013.01); *H01L 23/3735* (2013.01); *H01L 23/473* (2013.01); *H01L 23/492* (2013.01); *H01L 24/33* (2013.01); *H01L 2924/13055* (2013.01); *H01L 2924/13064* (2013.01); *H01L 2924/13091* (2013.01)
USPC ........... 257/177; 257/178; 257/181; 257/719; 257/E23.08

(58) Field of Classification Search
USPC ................. 257/177, 178, 180, 181, 718, 719, 257/E23.08, E23.088
See application file for complete search history.

(56) References Cited

U.S. PATENT DOCUMENTS

| | | | | |
|---|---|---|---|---|
| 7,557,442 | B2 * | 7/2009 | Licht | 257/720 |
| 7,605,451 | B2 * | 10/2009 | Moline | 257/666 |
| 7,786,565 | B2 * | 8/2010 | Kitabatake et al. | 257/689 |
| 2007/0267739 | A1 | 11/2007 | Kajiwara et al. | |
| 2008/0128896 | A1 | 6/2008 | Toh et al. | |

FOREIGN PATENT DOCUMENTS

| | | |
|---|---|---|
| JP | A-2002-231850 | 8/2002 |
| JP | A-2005-72351 | 3/2005 |
| JP | A-2007-311441 | 11/2007 |
| JP | A-2008-166680 | 7/2008 |
| JP | A-2008-258547 | 10/2008 |
| JP | A-2010-268011 | 11/2010 |
| JP | A-2011-109144 | 6/2011 |

\* cited by examiner

*Primary Examiner* — Minh-Loan Tran
(74) *Attorney, Agent, or Firm* — Oliff PLC

(57) ABSTRACT

A heat transfer member is disposed between a semiconductor element and an electrode plate. The heat transfer member comprises a metal portion extending between a first face at the semiconductor element side and a second face at the plate electrode side, and a ceramic portion surrounding the metal portion. An area of the first face is less than an area of the second face in the metal portion.

5 Claims, 6 Drawing Sheets

HEAT TRANSFER MEMBER AND MODULE WITH THE SAME

CROSS-REFERENCE TO RELATED APPLICATION

This application claims priority to Japanese Patent Application No. 2012-126705 filed on Jun. 4, 2012, the contents of which are hereby incorporated by reference into the present application.

1. Technical Field

The technique disclosed in the specification relates to a heat transfer member disposed between a semiconductor element and an electrode plate. Further, the technique disclosed in the specification relates to a module with the heat transfer member.

2. Description of Related Art

There has been developed a module for radiating heat generated in a semiconductor element from both surfaces of the semiconductor element. In the module of this type, a cooler, an insulating substrate, a semiconductor element, a heat transfer member, and an electrode plate are laminated in this order. In the module of this type, heat generated in the semiconductor element is radiated from a rear surface of the semiconductor element via the insulating substrate and the cooler and also radiated from a front surface of the semiconductor element via the heat transfer member and the electrode plate.

Characteristics of the heat transfer member are desired to include both low electric resistance and quick radiation of the heat generated in the semiconductor element. Therefore, as a material of the heat transfer member, metal having a small resistance value and large thermal conductivity is used. In general, a coefficient of linear expansion of metal is larger than a coefficient of linear expansion of a semiconductor. Therefore, a larger difference in the coefficient of linear expansion is present between the semiconductor element and the heat transfer member. As a result, in the module of this type, deterioration in reliability such as a joining failure of the semiconductor element and the heat transfer member is caused by thermal strain that occurs because of a thermal expansion difference between the semiconductor element and the heat transfer member.

Japanese Patent Application Publication No. 2010-268011 discloses an example of a technique for relaxing such thermal strain. A heat transfer member described in the patent document 1 includes a metal portion and a ceramic portion surrounding the metal portion. With the technique, since the ceramic portion suppresses thermal expansion of the metal portion, a thermal expansion difference between a semiconductor element and the heat transfer member is reduced and thermal strain that occurs between the semiconductor element and the heat transfer member is relaxed.

In the heat transfer member disclosed in Japanese Patent Application Publication No. 2010-268011, in order to further reduce the thermal strain that occurs between the semiconductor element and the heat transfer member, it is desirable to reduce an area of the metal portion on a surface joined to the semiconductor element. However, the heat transfer member described in Japanese Patent Application Publication No. 2010-268011 has a form in which the metal portion and the ceramic portion respectively extend in parallel to a vertical direction. Therefore, when the area of the metal portion on the surface joined to the semiconductor element is reduced, a volume of the metal portion is also reduced and a heat radiation effect is deteriorated.

It is an object of a technique disclosed in this specification to provide a heat transfer member having a high heat radiation effect while suppressing a thermal expansion difference between the heat transfer member and a semiconductor element.

BRIEF SUMMARY OF INVENTION

A heat transfer member disclosed in this specification is to be disposed between a semiconductor element and an electrode plate. The heat transfer member includes a metal portion and a ceramic portion. The metal portion extends between a first face on the semiconductor element side and a second face on the electrode plate side. The ceramic portion surrounds the metal portion. In the metal portion, an area of the first face is less than an area of the second face.

In the heat transfer member in the aspect explained above, the area of the metal portion is relatively small on the first face on the semiconductor element side and the area of the metal portion is relatively large on the second face on the electrode plate side. Therefore, since an opposing area of the metal portion and the semiconductor element is small, thermal strain due to a thermal expansion difference between the metal portion and the semiconductor element is suppressed. On the other hand, since an opposing area of the metal portion and the electrode plate is large, an effect of radiating heat generated in the semiconductor element to the electrode plate via the metal portion is high.

A module disclosed in this specification includes a cooler, an insulating substrate disposed on the cooler, a semiconductor element disposed on the insulating substrate, a heat transfer member disposed on the semiconductor element, and an electrode plate disposed on the heat transfer member. The heat transfer member includes a metal portion extending between a first face on the semiconductor element side and a second face on the electrode plate side and a ceramic portion surrounding the metal portion. In the metal portion, an area of the first face is less than an area of the second face.

DETAILED DESCRIPTION OF INVENTION

Figure 1:
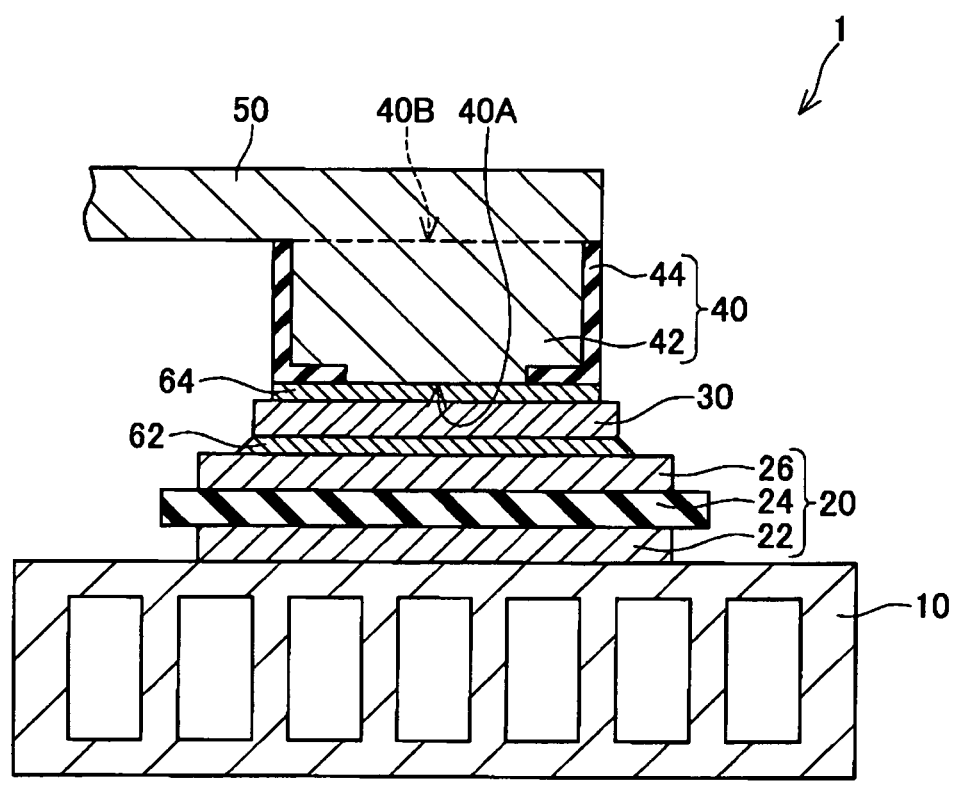
FIG. 1 shows an example of a configuration of a power module.

Technical features disclosed in this specification are summarized below. Note that matters described below respectively independently have technical utility.

(Feature 1) A heat transfer member disclosed in this specification is disposed between a semiconductor element and an electrode plate. A semiconductor material of the semiconductor element is not specifically limited. In an example, as a material of the semiconductor element, a silicon, silicon carbide, or gallium nitride material may be used. A type of the semiconductor element is not specifically limited either. In an example, as the type of the semiconductor element, a MOSFET, an IGBT, a diode, a thyristor, an HFET, or an HEMT may be used. The semiconductor element may be either a vertical type or a horizontal type. The electrode plate is a conductor member for an electric current, which flows through the semiconductor element, to be input or output. In an example, the electrode plate may be a conductor member electrically connected to a front surface electrode of the vertical-type semiconductor element or may be a conductor member electrically connected to a rear surface electrode of the vertical-type semiconductor element.

(Feature 2) The heat transfer member disclosed in this specification may include a metal portion extending between a first face on the semiconductor element side and a second face on the electrode plate side and a ceramic portion surrounding the metal portion. The material of the metal portion is not specifically limited. A material of the metal portion is desirably a material having small electric resistance, small specific heat and large thermal conductivity. In an example, as the material of the metal portion, copper, aluminum, gold, or silver may be used. A material of the ceramic portion is not specifically limited either. The material of the ceramic portion is desirably a material having a Young's modulus higher than a Young's modulus of the material of the metal portion (equal to or higher than 120 MPa) and having a coefficient of linear expansion smaller than a coefficient of linear expansion of the material of the metal portion (equal to or smaller than 10 ppm/K). In an example, as the material of the ceramic portion, aluminum nitride (AlN), silicon nitride ($Si_3N_4$), alumina ($Al_2O_3$), or zirconium ($ZrO_3$) may be used.

(Feature 3) In the metal portion, an area of the first face may be less than an area of the second face.

(Feature 4) In the metal portion, a first portion where an area of a cross section parallel to the first face and the second face is of a first value and a second portion where the area is of a second value may be present. The first value is smaller than the second value. In this case, the first portion may be located on the first face side and the second portion may be located on the second face side.

(Feature 5) The metal portion may be configured such that the area of the cross section parallel to the first face and the second face gradually increases from the first face to the second face.

(Feature 6) The metal portion may be formed integrally with the electrode plate. According to this aspect, since a joining surface is absent between the heat transfer member and the electrode plate, concentration of thermal strain between the heat transfer member and the electrode plate is relaxed. Note that, when the metal portion and the electrode plate are integrally molded, the second face in this specification refers to a cut surface between a portion perceivable as the metal portion and a portion perceivable as the electrode plate.

(Feature 7) The metal portion of the first face may be located above an element region of the semiconductor element. The element region of the semiconductor element is a region where a gate structure is formed. According to this aspect, heat generated in the semiconductor element is efficiently radiated via the metal portion. Further, the ceramic portion of the first face may be located above a termination region of the semiconductor element. The termination region of the semiconductor element is a region disposed around the element region and where the gate structure is not formed. For example, in the termination region of the semiconductor element, a guard ring, a resurf layer, and the like for withstand pressure improvement are formed. According to this aspect, capacity coupling between the metal portion and the termination region of the semiconductor element is suppressed and deterioration in withstand pressure of the termination region of the semiconductor element is suppressed.

Embodiment

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved heat transfer members, as well as modules with the same.

Moreover, combinations of features and steps disclosed in the following detail description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

In FIG. 1, a configuration of a vehicle-mounted power module 1 is shown. The power module 1 is used for an inverter device connected between a direct-current power supply and an alternating-current motor. The power module 1 has a structure in which a cooler 10, an insulating substrate 20, a semiconductor element 30, a heat transfer member 40, and an electrode plate 50 are laminated in this order.

The cooler 10 is a water cooling type and includes a plurality of through-holes through which cooling water flows. In an example, an Al—Mn aluminum alloy is used as a material of the cooler 10.

The insulating substrate 20 is brazed on the cooler 10 via a brazing filler material and has a structure in which a metal layer 22, an insulating layer 24, and a wiring layer 26 are laminated. In an example, copper is used as a material of the metal layer 22 and the wiring layer 26 and aluminum nitride is used as a material of the insulating layer 24.

The semiconductor element 30 is joined on the insulating substrate 20 via a solder material 62. The semiconductor element 30 is made from silicon (Si) or silicon carbide (SiC) and is a power device of MOSFET or IGBT. In an example, an Sn—Cu or Sn—Ag—Cu material is used as a material of the solder material 62.

The heat transfer member 40 is joined on the semiconductor element 30 via a solder material 64. The heat transfer member 40 includes a metal portion 42 and a ceramic portion 44. The metal portion 42 has a generally right cylindrical form and extends between a first face 40A on a semiconductor element 30 side and a second face 40B on an electrode plate 50 side. In an example, copper is used as a material of the metal portion 42. The ceramic portion 44 has a generally cylindrical form and surrounds the metal portion 42 circulating around a side surface of the metal portion 42. The ceramic portion 44 also extends between the first face 40A on the semiconductor element 30 side and the second face 40B on the electrode plate 50 side. In an example, aluminum nitride is used as a material of the ceramic portion 44. The metal portion 42 and the ceramic portion 44 are joined by brazing or soldering.

The electrode plate 50 is disposed on the heat transfer member 40 and extends sideward from a top of the heat transfer member 40. The electrode plate 50 is a metal plate having a tabular form. In an example, copper is used as a material of the electrode plate 50. Note that both of the materials of the electrode plate 50 and the heat transfer member 40 are copper. The electrode plate 50 and the heat transfer member 40 are integrally molded.

Figure 2:
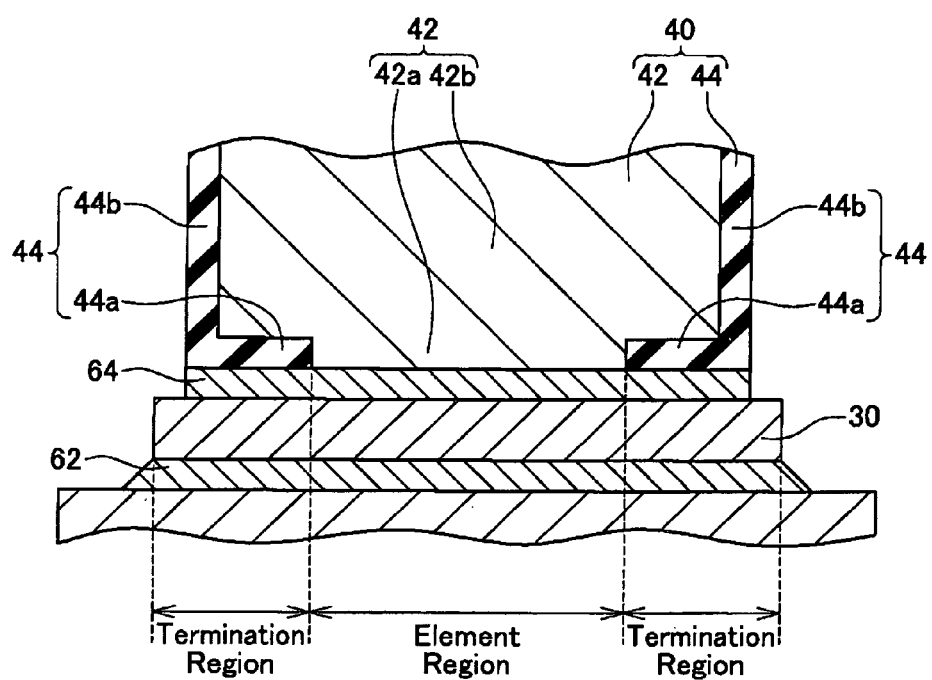
FIG. 2 shows an enlarged sectional view near an interface of a semiconductor element and a heat transfer member.

The heat transfer member 40 is explained in detail. As shown in FIG. 2, when observed on a cross section parallel to the first face 40A and the second face 40B (corresponding to a cross section orthogonal to an up down direction on the paper surface), the generally right cylindrical metal portion 42 is configured by a first metal portion 42a having a small sectional area and a second metal portion 42b having a large sectional area. The first metal portion 42a is located on the semiconductor element 30 side and joined to the semiconductor element 30 via solder 64. The second metal portion 42b is located on the electrode plate 50 side. When observed on the cross section parallel to the first face 40A and the second face 40B (the cross section orthogonal to the up down direction on the paper surface), the generally cylindrical ceramic portion 44 is configured by a first ceramic portion 44a having a large sectional area and a second ceramic portion 44b having a small sectional area. The first ceramic portion 44a is located on the semiconductor element 30 side and surrounds the first metal portion 42a. The first ceramic portion 44a is joined to the semiconductor element 30 via the solder 64. The second ceramic portion 44b is located on the electrode plate 50 side and surrounds the second metal portion 42b.

The first metal portion 42a of the metal portion 42 is located above an element region (a region where a gate structure is disposed) of the semiconductor element 30. The first ceramic portion 44a of the ceramic portion 44 is located above a termination region (a region disposed around the element region and where the gate structure is not disposed) of the semiconductor element 30.

Figure 3:
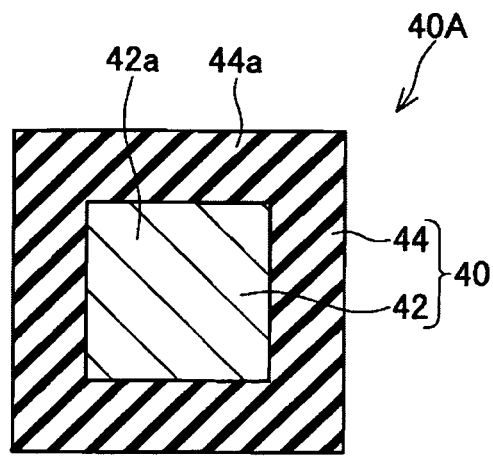
FIG. 3 shows a surface of the heat transfer member on a semiconductor element side.
Figure 4:
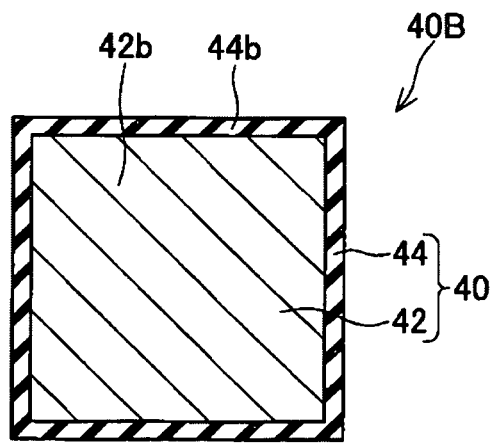
FIG. 4 shows a surface of the heat transfer member on an electrode plate side.

The first face 40A of the heat transfer member 40 is shown in FIG. 3. The second face 40B of the heat transfer member 40 is shown in FIG. 4. The heat transfer member 40 is configured such that an area of the metal portion 42 (corresponding to the first metal portion 42a) of the first face 40A is relatively small and an area of the metal portion 42 (corresponding to the second metal portion 42b) of the second face 40B is relatively large. On the other hand, the heat transfer member 40 is configured such that an area of the ceramic portion 44 (corresponding to the first ceramic portion 44a) of the first face 40A is relatively large and an area of the ceramic portion 44 (corresponding to the second ceramic portion 44b) of the second face 40B is relatively small.

Characteristics of the power module 1 are explained. Silicon is used as the material of the semiconductor element 30. A coefficient of linear explanation of the semiconductor element 30 is about 3. Copper is used as a material of the metal portion 42 of the heat transfer member 40. A coefficient of linear expansion of the metal portion 42 is about 17. Aluminum nitride is used as a material of the ceramic portion 44 of the heat transfer member 40. A coefficient of linear expansion of the ceramic portion 44 is 4. That is, a difference in the coefficient of linear expansion between the metal portion 42 of the heat transfer member 40 and the semiconductor element 30 is larger than a difference in the coefficient of linear expansion between the ceramic portion 44 of the heat transfer member 40 and the semiconductor element 30.

In the heat transfer member 40 of the power module 1, the ceramic portion 44 surrounds the metal portion 42 and thermal expansion of the metal portion 42 is suppressed. Therefore, the heat transfer member 40 as a whole has a coefficient of linear expansion depending on the ceramic portion 44. Since the difference in the coefficient of thermal expansion between the ceramic portion 44 of the heat transfer member 40 and the semiconductor element 30 is small, thermal strain that occurs between the semiconductor element 30 and the heat transfer member 40 is suppressed.

Further, in the power module 1, an area of the metal portion 42 on the first face 40A of the heat transfer member 40 is small. Therefore, thermal strain that occurs between the semiconductor element 30 and the heat transfer member 40 is suppressed. On the other hand, an area of the metal portion 42 on the second face 40B of the heat transfer member 40 is large. Therefore, heat generated in the semiconductor element 30 can be efficiently radiated to the electrode plate 50. Further, since a volume of the metal portion 42 in the heat transfer member 40 is large, a heat capacity increases. Therefore, a sudden temperature rise of the heat transfer member 40 is suppressed.

Other characteristics of the power module 1 are explained below.

(1) In the power module 1, the metal portion 42 of the heat transfer member 40 and the electrode plate 50 are integrally molded. Therefore, since a joining surface is absent between the metal portion 42 of the heat transfer member 40 and the electrode plate 50, concentration of thermal strain between the metal portion 42 of the heat transfer member 40 and the electrode plate 50 is suppressed.

(2) As shown in FIG. 2, in the heat transfer member 40, the metal portion 42 is located above the element region of the semiconductor element 30 and the ceramic portion 44 is located above the termination region of the semiconductor element 30. In general, a temperature distribution in the semiconductor element 30 has a peak in a center of the element region. Since the metal portion 42 is located above the element region of the semiconductor element 30, heat generated in the semiconductor element 30 can be efficiently radiated. Since the ceramic portion 44 is located above the termination region of the semiconductor element 30, capacity coupling between the metal portion 42 and the termination region of the semiconductor element 30 is suppressed and withstand pressure of the termination region is maintained.

Figure 5:
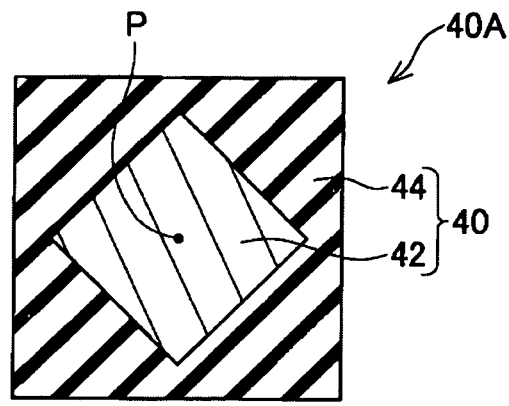
FIG. 5 shows another example of the surface of the heat transfer member on the semiconductor element side.
Figure 6:
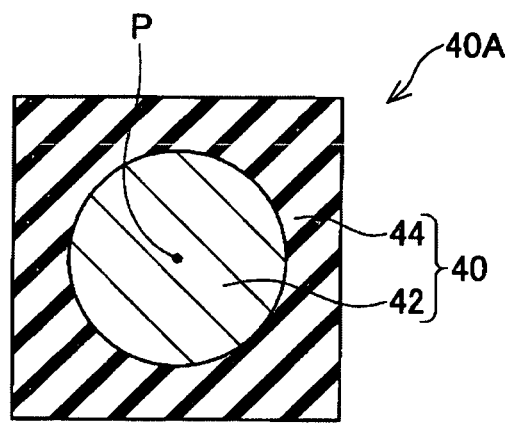
FIG. 6 shows another example of the surface of the heat transfer member on the semiconductor element side.
Figure 7:
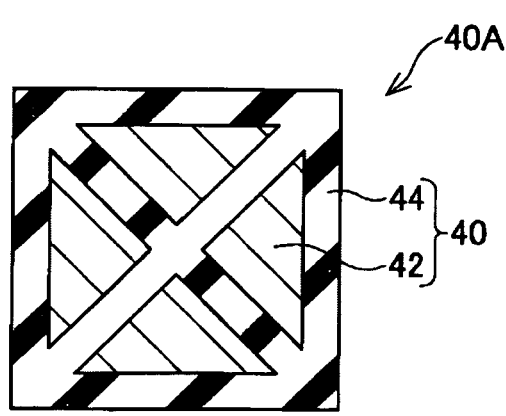
FIG. 7 shows another example of the heat transfer member on the semiconductor element side.

(3) Other examples of the first face 40A of the heat transfer member 40 are shown in FIGS. 5 to 7. In general, a maximum value of thermal strain appears on a diagonal line having a maximum distance. Therefore, in order to suppress thermal strain, it is desirable to adopt a layout for reducing a length of the metal portion 42 arranged on the diagonal line. As shown in FIGS. 5 and 6, when observed in an arbitrary direction passing a center point P of the heat transfer member 40, a layout in which a minimum value of (length of the metal portion 42)/(length of the heat transfer member 40) is on the diagonal line is desirable. As shown in FIG. 7, a layout in which the metal portion 42 is not arranged on the diagonal line is desirable.

Figure 8:
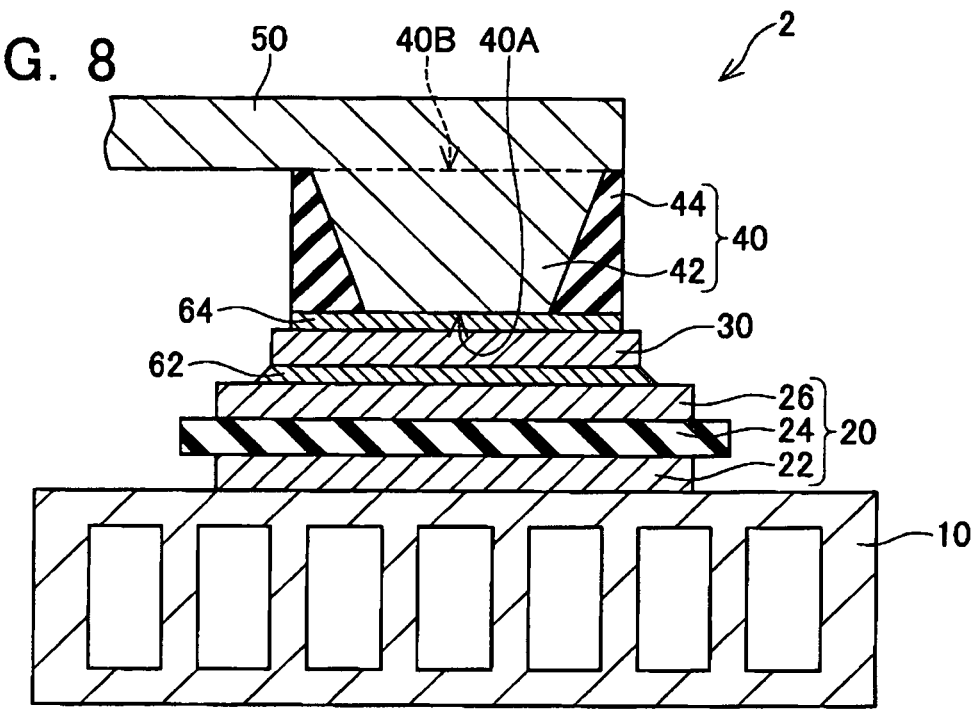
FIG. 8 shows another example of the configuration of the power module.

(4) The power module 1 may include the heat transfer member 40 having a form shown in FIG. 8. When observed on the cross section parallel to the first face 40A and the second face 40B, the heat transfer member 40 in this example is configured such that a sectional area of the metal portion 42 gradually increases from the first face 40A to the second face 40B. The heat transfer member 40 in this example has effects same as the effects explained above.

Figure 9:
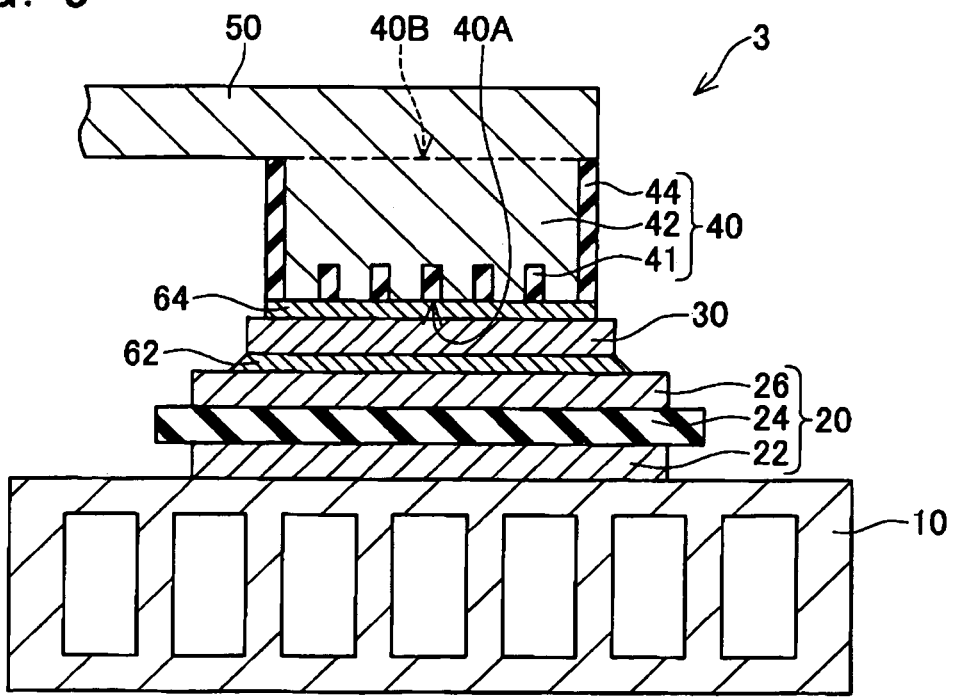
FIG. 9 shows another example of the configuration of the power module.
Figure 10:
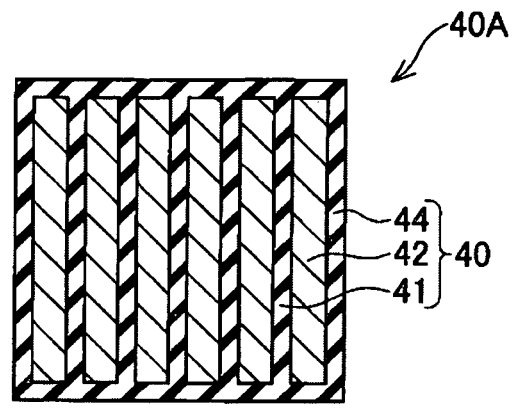
FIG. 10 shows an example of the surface of the heat transfer member on the semiconductor element side in the module shown in FIG. 9.
Figure 11:
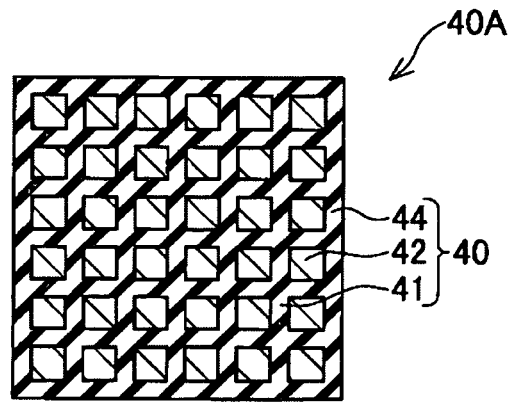
FIG. 11 shows another example of the surface of the heat transfer member on the semiconductor element side in the power module shown in FIG. 9.

(5) The power module 1 may include the heat transfer member 40 having a form shown in FIG. 9. The ceramic portion 44 of the heat transfer member 40 in this example includes a ceramic mesh portion 41 on the first face 40A side. Therefore, the heat transfer member 40 has a characteristic in that, when observed on the cross section parallel to the first face 40A and the second face 40B, the metal portion 42 on the first face 40A side is divided into a plurality of portions. For example, as shown in FIG. 10, the ceramic mesh portion 41 may be formed in a stripe shape. Alternatively, as shown in FIG. 11, the ceramic mesh portion 41 may be formed in a lattice shape. The heat transfer member 40 in these examples has effects same as the effects explained above. Further, in the heat transfer member 40 in these examples, since the metal portion 42 on the first face 40A side is divided into a plurality of portions, thermal strain is suppressed from accumulating and increasing and is further relaxed.

What is claimed is:

1. A heat transfer member to be disposed between a semiconductor element and an electrode plate, the heat transfer member comprising:
   a metal portion extending between a first face on a semiconductor element side and a second face on a plate electrode side; and
   a ceramic portion surrounding the metal portion, wherein
   an area of the first face is less than an area of the second face in the metal portion.

2. The heat transfer member according to claim 1, wherein the metal portion is integrally formed with the plate electrode.

3. The heat transfer member according to claim 1, wherein the metal portion on the first face is located above an element region of the semiconductor element, and
   the ceramic portion on the first face is located above a termination region of the semiconductor element.

4. A module comprising:
   a cooler;
   an insulating substrate disposed on the cooler;
   a semiconductor element disposed on the insulating substrate;
   a heat transfer member disposed on the semiconductor element, and
   an electrode plate disposed on the heat transfer member, wherein
   the heat transfer member includes:
      a metal portion extending between a first face on the semiconductor element side and a second face on the plate electrode side; and
      a ceramic portion surrounding the metal portion, and
   an area of the first face is less than an area of the second face in the metal portion.

5. An electrode member to be disposed on a semiconductor element, the electrode member comprising:
   a heat transfer portion to be located on the semiconductor element, and
   an plate portion located on the heat transfer portion and extending sideward from a top of the heat transfer portion, wherein
   the heat transfer portion comprises:
      a metal portion; and
      a ceramic portion surrounding the metal portion, wherein
   an area of the metal portion at a face to be joined to the semiconductor element is less than an area of the metal portion at a boundary between the heat transfer portion and the plate portion.

* * * * *